(12) United States Patent
Park et al.

(10) Patent No.: US 6,867,756 B2
(45) Date of Patent: Mar. 15, 2005

(54) ELECTROLUMINESCENCE DISPLAY DEVICE

(75) Inventors: Jae Yong Park, Seoul (KR); Ock Hee Kim, Kyonggi-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 379 days.

(21) Appl. No.: 09/989,663

(22) Filed: Nov. 21, 2001

(65) Prior Publication Data

US 2002/0060654 A1 May 23, 2002

(30) Foreign Application Priority Data

Nov. 23, 2000 (KR) .................................. P2000-69847

(51) Int. Cl.⁷ .................................................. G09G 3/30
(52) U.S. Cl. .......................................... 345/76; 345/77
(58) Field of Search ............................. 345/76, 34, 42, 345/52, 77, 82; 313/479, 506, 509, 493; 257/40, 71, 347; 315/169.3; 349/113

(56) References Cited

U.S. PATENT DOCUMENTS

| | | | | |
|---|---|---|---|---|
| 4,593,228 A | * | 6/1986 | Albrechtson et al. | 313/509 |
| 5,771,321 A | * | 6/1998 | Stern | 385/31 |
| 6,091,078 A | * | 7/2000 | Codama | 257/40 |
| 6,249,082 B1 | * | 6/2001 | Fukuyoshi et al. | 313/479 |
| 6,259,500 B1 | * | 7/2001 | Kijima et al. | 349/113 |
| 6,462,722 B1 | * | 10/2002 | Kimura et al. | 345/76 |
| 6,495,886 B1 | * | 12/2002 | Yamazaki et al. | 257/347 |
| 6,522,079 B1 | * | 2/2003 | Yamada | 315/169.3 |
| 6,555,875 B2 | * | 4/2003 | Kawasaki et al. | 257/347 |
| 6,590,229 B1 | * | 7/2003 | Yamazaki et al. | 257/71 |
| 6,788,278 B2 | * | 9/2004 | Aoki | 345/82 |
| 2002/0070663 A1 | * | 6/2002 | Ogura et al. | 313/506 |
| 2003/0146695 A1 | * | 8/2003 | Seki | 313/506 |
| 2003/0164674 A1 | * | 9/2003 | Imamura | 313/493 |
| 2004/0004433 A1 | * | 1/2004 | Lamansky et al. | 313/506 |

* cited by examiner

Primary Examiner—Vijay Shankar
Assistant Examiner—Prabodh M. Dharia
(74) Attorney, Agent, or Firm—Morgan Lewis & Bockius LLP

(57) ABSTRACT

An electroluminescence display device includes a transparent substrate, a plurality of first electrodes formed on the transparent substrate, an electroluminescence layer and a plurality of second electrodes sequentially disposed on the first electrodes, a packaging plate having a plurality of protrusions formed at a side opposite to the plurality of second electrodes, an absorber contained within each protrusion, a plurality of semi-transparent films disposed on the packaging plate and each absorber, and an adhesive attaching the transparent substrate to the packaging plate to oppose each other.

21 Claims, 4 Drawing Sheets

ELECTROLUMINESCENCE DISPLAY DEVICE

The present invention claims the benefit of Korean Patent Application No. P2000-69847 filed in Korea on Nov. 23, 2000, which is hereby incorporated by reference.

BACKGROUND OF THE INVENTION

1. Field of the Invention

The present invention relates to a flat display device, and more particularly, to an electroluminescence device (ELD) using organic and inorganic light emitting materials.

2. Background of the Related Art

Presently, many different types of flat display devices are being used. Among the most popular are liquid crystal displays (LCDs), field emission displays (FEDs), electroluminescence devices (ELDs), and plasma display panels (PDPs). In particular, ELDs are formed in such a manner that an electrode is attached to both sides of an electroluminescence (EL) layer consisting of a hole transport layer, an light-emitting layer, and an electron transport layer. The ELD belongs to a group of next generation flat display devices because of its characteristic wide viewing angle, high aperture ratio, and high chromaticity. ELDs may be divided largely into inorganic and organic ELDs according to materials used to form the EL layer. Inorganic ELDs produce light by accelerating electrons by a high electric field. The accelerated electrons collide with luminescent impurities and the luminescent impurities are driven into a high energy state. The excited luminescent impurities fall to a ground state and emit energy in the form of light. In organic ELDs, electrons and holes are injected from an anode electrode and a cathode electrode, respectively, make an excited pair, and fall from an excite state to a ground state, thereby emitting light. Accordingly, since organic ELDs require lower driving voltages than inorganic ELDs and do not require a backlight, organic ELDs can be formed of a thin structure having low power consumption characteristics.

Generally, ELDs can be divided into a passivation and active matrix ELDs according to a method for driving a display panel. Passivation ELDs have a relatively simple structure that includes an organic layer formed between two orthogonal electrodes. However, active matrix ELDs have a more complicated structure that includes a switching thin film transistor (TFT1) and a light-emitting thin film transistor (TFT2) for controlling emission of light in each pixel region and actively drives respective pixels.

An ELD according to the related art will be explained with reference to the following drawings.

FIG. 1 is a driving circuit of a related art ELD, FIG. 2A is a cross-sectional view illustrating a related art ELD, and FIG. 2B is a cross-sectional view illustrating problems of a related art ELD.

In general, the ELD includes an anode electrode formed on a transparent substrate, an EL layer formed at an upper portion of the anode electrode, a cathode electrode formed on the EL layer, and a packaging plate attached to an upper portion of the cathode electrode, the packaging plate opposite to the transparent substrate. A passivation ELD includes a transparent anode electrode arranged in a line as a belt form on a transparent substrate formed of glass material, a passivation layer is formed on an entire surface including the anode electrode, an EL layer formed by depositing a hole transparent layer, an emitting layer, and an electron transparent layer on the passivation layer, a cathode electrode formed as a belt form crossing the anode electrode on the EL layer, a packaging plate provided with absorber, the absorber fixed by a semi-transparent film, and an adhesive for attaching the transparent glass substrate to the packaging plate to oppose each other.

In FIG. 1, the active matrix ELD includes a gate line (G.L) and a data line (D.L) orthogonally crossing each other and having a plurality of pixels, thin film transistors (T1) formed in the respective pixel regions and thin film transistors (T2), an EL device connected to an output terminal of the thin film transistor T2, and a storage capacitor (Cst) connected to an output terminal of the thin film transistor T1. In addition, a voltage (VDD) is connected between an input terminal of the thin film transistor T2 and the storage capacitor (Cst). The thin film transistor T1 selectively applies an image signal of the data line (D.L) to the respective pixel regions by an injection signal of the gate line (G.L), and the thin film transistor T2 controls emission of the EL device that consists of an anode electrode, an EL layer, a cathode electrode.

In FIG. 2A, the ELD includes a transparent substrate 10 having insulating characteristics, a gate line (not shown) and a data line (not shown) orthogonally crossing with each other on the transparent substrate 10, a thin film transistor T1 (not shown) formed at a crossing point of the gate and data lines, a thin film transistor 7 connected to an output terminal of the thin film transistor T1 (not shown), an anode electrode 8 formed of a material such as ITO, for example, and connected to an output terminal of the thin film transistor 7 for emitting light, a passivation layer 9 formed on an entire surface including the anode electrode 8, an EL layer 12 formed on the passivation layer 9 by depositing a hole transport layer 1, an emitting layer 2, and an electron transport layer 3, a cathode electrode 14 of a metal material formed on the EL layer 12, a packaging plate 19 provided with absorber 16, the absorber fixed by a semi-transparent film 15, an adhesive 18 for attaching the transparent substrate 10 to the packaging plate 19 to oppose each other. The thin film transistor T1 (of FIG. 1) is connected not only to the thin film transistor 7 but also to the storage capacitor ("Cst" of FIG. 1) for selectively applying an image signal of the data line to the anode electrode 8 by an injection signal of the gate line.

In FIG. 2A, the packaging plate 19 and the glass substrate 10 are attached by an encapsulation method by the adhesive 18, such as epoxy resin, for example, in a sealed environment with inactive gases such as N and/or Ar, for example. However, since the EL layer 12 and the cathode electrode 14 are easily oxidized by reaction with oxygen, the devices are easily degraded.

To solve these problems, the absorber 16 is used to remove water in the display device, and to fill a space of the packaging plate and the substrate with inactive gases. The packaging plate 19 is formed of a material such as glass and/or plastic, for example. In addition, the absorber 16 is formed of a fine powder such as BaO, $CaCO_3$, zeolite, silicagel, and alumina, for example. The absorber 16 is contained in the packaging plate 19 and attached by the semi-transparent film 15 formed of a light weight material such paper and TEFLON®, for example. It is necessary to form the absorber 16 uniformly. Since the semi-transparent film 15 is formed of a light weight material, any increase in the weight of the absorber 16 will cause the semi-transparent film 15 to become displaced downward, thus causing the absorber 16 to come into contact with the cathode electrode 14, as shown in FIG. 1B. The problem is attenuated when an area of the ELD increases. Accordingly, when a large amount of absorber material is contained in the absorber 16 in a wider packaging plate, the semi-transparent film will become displaced downward very quickly. Conventionally, the semi-transparent film 15 is spaced from the cathode electrode 14 by less than a few hundred micrometers. Therefore, any displacement of the semi-transparent film 15 or non-uniform distribution of the absorber 16 may degrade the cathode electrode 14, thereby reducing durability of the ELD.

SUMMARY OF THE INVENTION

Accordingly, the present invention is directed to an ELD that substantially obviates one or more problems due to limitations and disadvantages of the related art.

An object of the present invention is to provide an ELD which prevents a semi-transparent film from becoming displaced by forming an absorber separately into a plurality of regions, thereby distributing the load of the absorber.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an electroluminescence display device includes a transparent substrate, a plurality of first electrodes formed on the transparent substrate, an electroluminescence layer and a plurality of second electrodes sequentially disposed on the first electrodes, a packaging plate having a plurality of protrusions formed at a side opposite to the plurality of second electrodes, an absorber contained within each protrusion, a plurality of semi-transparent films disposed on the packaging plate and each absorber, and an adhesive attaching the transparent substrate to the packaging plate to oppose each other.

In another aspect, an electroluminescence display device that actively drives a plurality of pixel regions defined on a transparent substrate includes a plurality of switching thin film transistors and light-emitting thin film transistors provided in each of the plurality of pixel regions, the electroluminescence display device is connected to the plurality of light-emitting thin film transistors for controlling emission of light, a packaging plate having a plurality of protrusions formed at a side opposite to the transparent substrate, an absorber contained within each of the plurality of protrusions, a semi-transparent film attached to the packaging plate and the absorber, and an adhesive attaching the transparent substrate to the packaging plate to oppose each other.

In another aspect, a packaging plate for an electroluminescence display device includes a plurality of protrusions formed at a first side, a plurality of absorbers arranged in a matrix pattern, each absorber contained within each of the plurality of protrusions, and a plurality of semi-transparent films disposed on a lower surface of the packaging plate and on each of the plurality of absorbers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
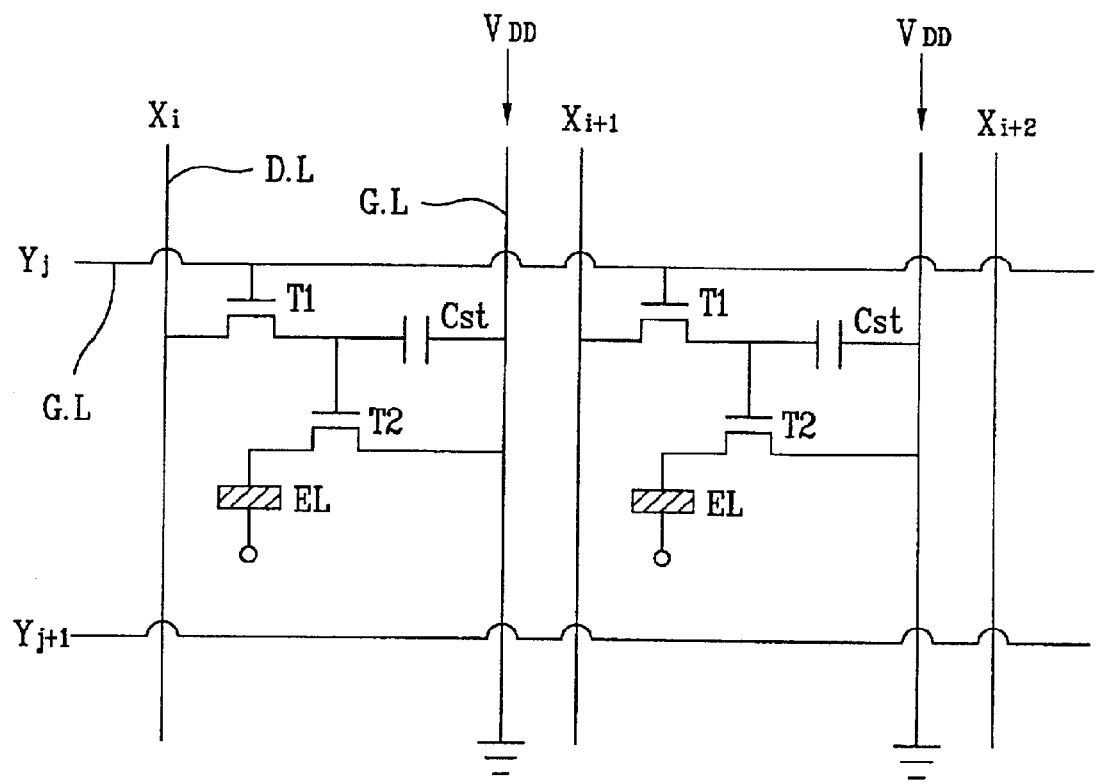
FIG. 1 is a driving circuit view of a related art ELD.
Figure 2A:
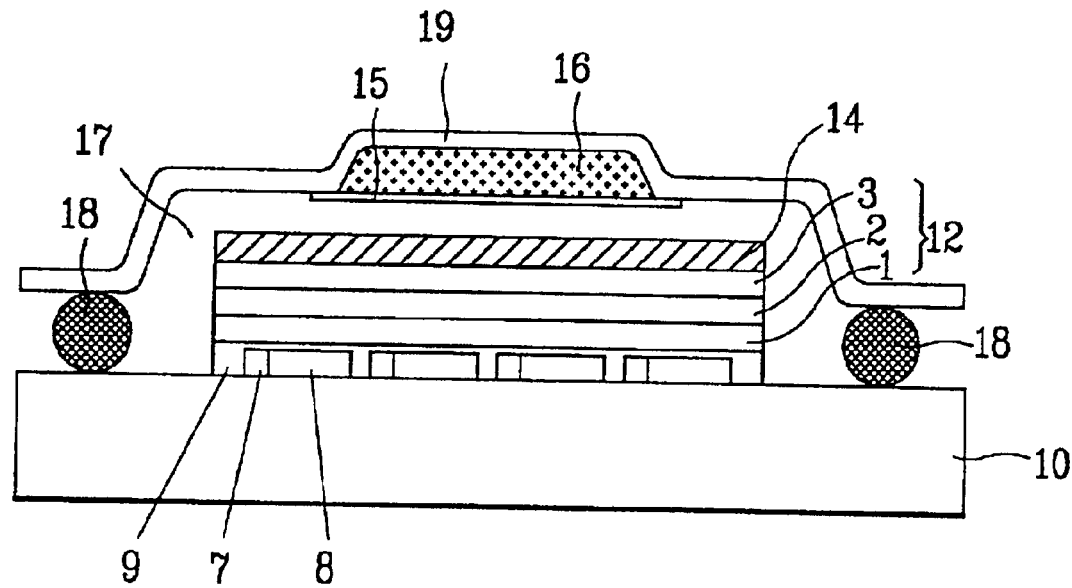
FIGS. 2A and 2B are a cross-sectional views of a related art ELD.
Figure 2B:
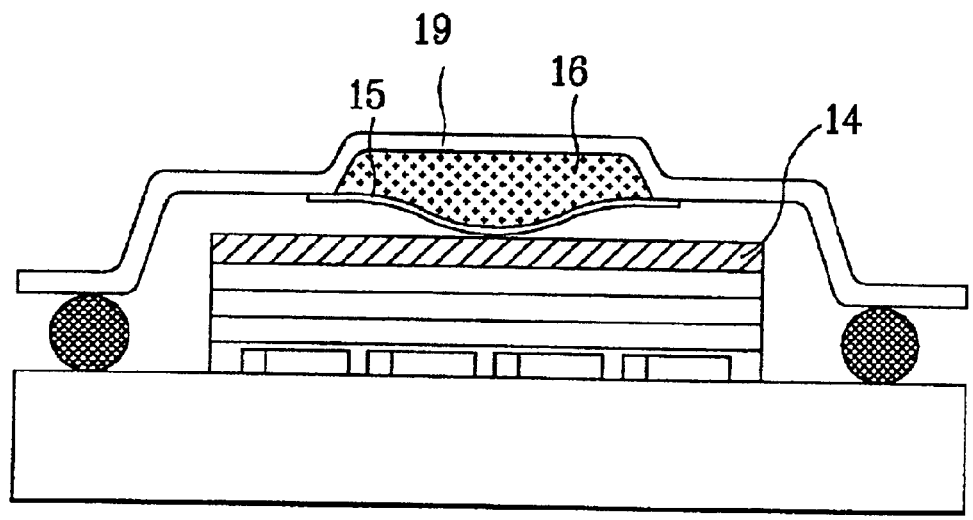
Figure 3A:
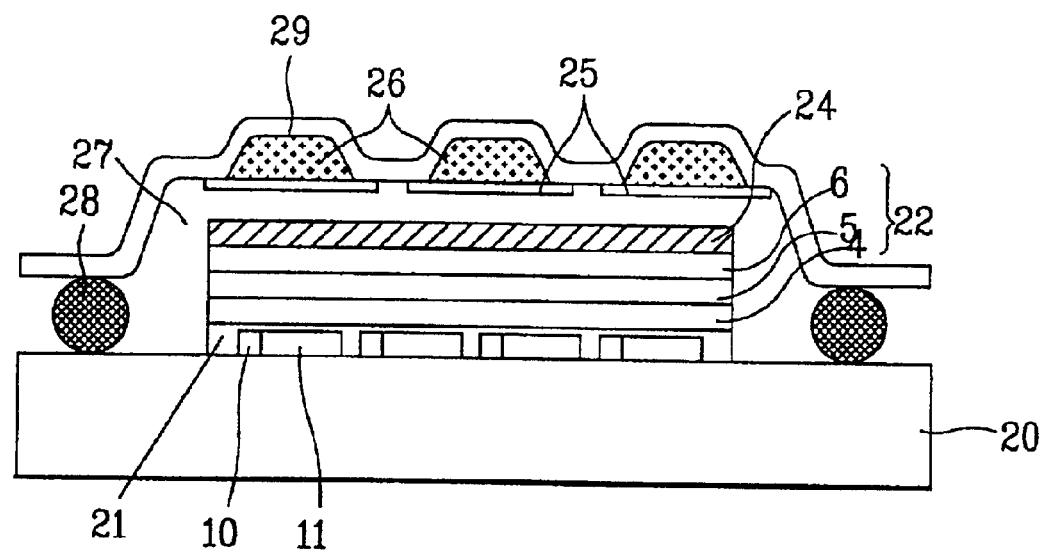
FIG. 3A is a cross-sectional view of an exemplary ELD according to the present invention.
Figure 3B:
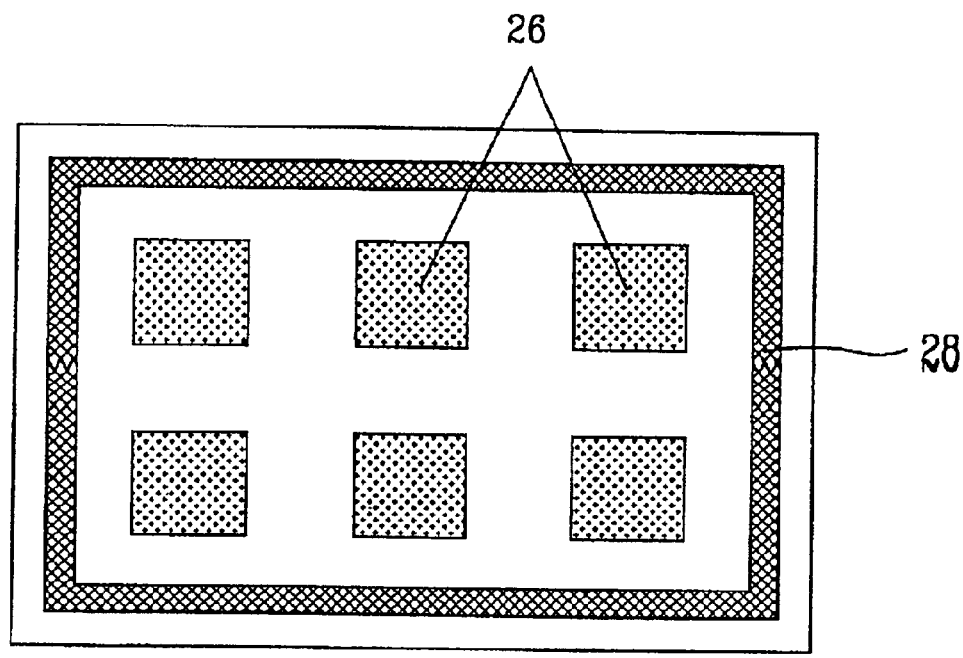
FIG. 3B is a plane view of an exemplary ELD according to the present invention.
Figure 4:
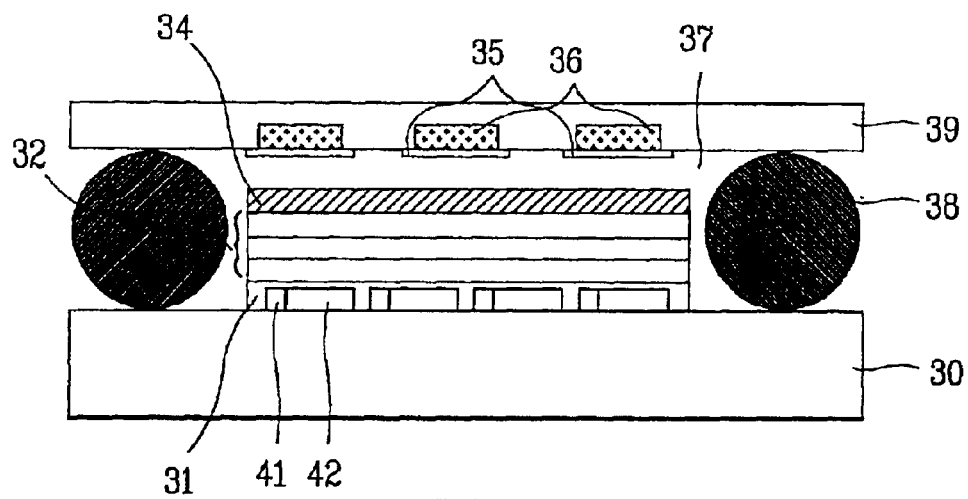
FIG. 4 is a cross-sectional view of another exemplary ELD according to the present invention.
Figure 5A:
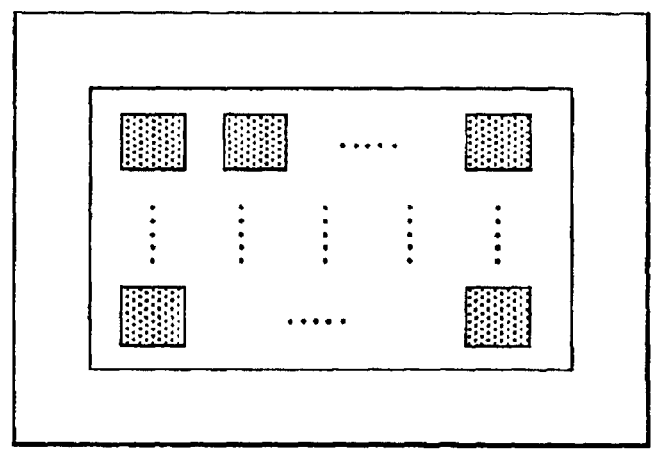
FIGS. 5A and 5B are plan views of an exemplary ELD provided with a plurality of protrusions according to the present invention.
Figure 5B:
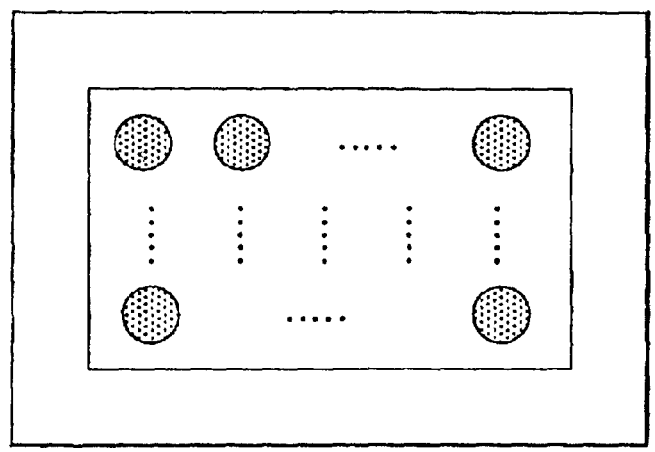

FIGS. 3A and 3B are cross-sectional and plan views of an exemplary ELD according to the present invention. Additionally, FIG. 4 is a cross-sectional view of another exemplary ELD according to the present invention, and FIGS. 5A and 5B are plan views of an exemplary ELD provided with a plurality of protrusions.

In FIGS. 3A and 3B, a ELD includes a transparent substrate 20 formed of glass, for example, on which light is transmitted and a picture screen is displayed, orthogonal gate lines (not shown) and data lines (not shown) cross each other on the transparent substrate 20 and having a plurality of pixel regions, a switching thin film transistor (TFT) 10 formed at a crossing point of the gate and data lines (not shown), a storage capacitor and light-emitting TFT respectively connected to an output terminal of the switching TFT 10, an anode electrode 11 formed in each pixel region and connected to the light-emitting TFT, a passivation layer 21 formed on an entire surface including the anode electrode 1; an EL layer 22 uniformly formed on the passivation layer 21, a cathode electrode 24 formed on an entire surface on the EL layer 22, a packaging plate 29 formed of a canister having a plurality of protrusions, an absorber 26 fixed within the protrusions of the packaging plate 29 by the semi-transparent film 25, and an adhesive 28 that attaches the transparent substrate 20 and the packaging plate 29.

The switching TFT includes a gate electrode that extends from the gate line, a semiconductor layer insulated from the gate electrode, and source and drain electrodes extending from the data lines and formed on the semiconductor layer. The EL layer 22 includes a hole transport layer 4, an emitting layer 5, and an electron transport layer 6. A hole and an electron injected from the anode electrode 11 and the cathode electrode 24, respectively, make an excited pair and fall from an excite state to a ground state, thereby emitting energy in the form of light. The anode electrode 11 may be formed of a transparent conductive material such as ITO, for example, by a vacuum deposition or sputtering process and subsequently patterned by a photolithographic process. The cathode electrode 24 may be formed by first covering a shadow mask on the EL layer 22 and then depositing materials such as Ca, Mg, Al, Cu, and Cr or an alloy of these materials, for in example.

The packaging plate 29 may be provided with a plurality of protrusions. The absorber 26 such as BaO, for example, may be contained within the protrusions and a semi-transparent film 25 may be attached to the absorber 26, thereby fixing the absorber to the packaging plate 29. The semi-transparent film 25 may be formed of paper or TEFLON®, for example. The packaging plate 29 has a sufficient number of the protrusions for the semi-transparent film 25 not to detach downward by a weight of the absorber 26. Alternatively, any number of different geometric shapes may be used to form the individual protrusions. For example, although square-shaped protrusions are shown, triangular, rectangular, circular, and hexagonal shapes may also be used. Furthermore, any number of different configuration patterns may be used to form the protrusions. For example, although a 2×3 matrix of protrusions is shown, a hexagonal configuration pattern may also be used. Even further, any combination of different geometric shapes and different configuration patterns may be used. For example, a hexagonal configuration pattern of triangular-shaped protrusions may be used. The total number of protrusions may be varied.

The adhesive 28 may be formed of epoxy resin, for example. The adhesive may be printed on an outer periphery of the transparent substrate 20, and then the transparent substrate 20 and the packaging plate 29 may be attached to oppose each other. It is necessary to perform the attaching process in an inert atmosphere such as N and Ar, for example, in order to fill a cavity 27 between the transparent substrate 20 and the packaging plate 29 with inert gases.

Another exemplary ELD according to the present invention includes a packaging plate formed of glass or plastic which are not susceptible to flexing.

In FIG. 4, the ELD includes a transparent substrate 30 having excellent insulating characteristics, two conductive lines orthogonally crossed each other on the transparent substrate 30 which divide unit pixel regions, switching TFTs formed at crossing points of the two conductive lines to apply a voltage selectively to each pixel region (not shown), a storage capacitor and light-emitting TFTs connected to an output terminal of the switching TFTs, respectively, an anode electrode 42 connected to the light-emitting TFTs, a passivation layer 31 formed by depositing an insulating material on an entire surface including the anode electrode 42, an EL layer 32 uniformly formed on the passivation film 31, a cathode electrode 34 formed of a metal material on an entire surface on the EL layer 32, a packaging plate 39 provided with a plurality of grooves with inner sides formed by molding, an absorber 36 fixed within the grooves of the packaging plate 39 by attaching a semi-transparent film 35, and an adhesive 38 attaching the transparent substrate 20 to the packaging plate 29 to oppose each other with cavity 37 formed therebetween. The grooves have sufficient size for the semi-transparent film 35 not to be displaced downward by a weight of the absorber 36. Like the ELD disclosed above with regard to FIGS. 3A and 3B, the grooves may vary in number, shape and/or configuration pattern. The absorber 36 may be formed of a powder such as BaO, $CaCO_3$, and/or zeolite, for example, and the semi-transparent film 35 may be formed of paper and/or TEFLON®, for example.

According to the present invention the ELD is not limited to an active matrix ELD. A packaging plate provided with a plurality of protrusions may also be used in a passivation ELD to form the absorber separately where a large area is required.

The ELD of the present invention has the following advantages. The absorber is prevented from becoming displaced downward toward the adjacent cathode electrode by forming a plurality of protrusions having a fixed area in a wider packaging plate area. By forming the absorber separately with a plurality of protrusions, the total weight of the absorber is distributed. Accordingly, the emitting light is not degraded, and a stable and durable luminescence display device having a large area can be obtained. In addition, the absorber is dispersed uniformly on an entire surface of the device, thus enhancing the reliability of the device.

It will be apparent to those skilled in the art that various modifications and variations can be made in the electroluminescence display device of the present invention without departing from the spirit or scope of the invention. Thus, it is intended that the present invention cover the modifications and variations of this invention provided they come within the scope of the appended claims and their equivalents.

What is claimed is:

1. An electroluminescence display device, comprising:
 a transparent substrate;
 a plurality of first electrodes formed on the transparent substrate;
 an electroluminescence layer and a plurality of second electrodes sequentially disposed on the first electrodes;
 a packaging plate having a plurality of grooves formed at a side opposite to the plurality of second electrodes;
 an absorber contained within each groove at least to remove water in the electroluminescence display device;
 a plurality of semi-transparent films disposed on the packaging plate and each absorber; and
 an adhesive attaching the transparent substrate to the packaging plate to oppose each other.

2. The device according to claim 1, wherein the plurality of first electrodes are arranged in parallel in a line, and the plurality of second electrodes are arranged orthogonal to and cross the plurality of first electrodes.

3. The device according to claim 1, wherein each of the plurality of first electrodes are disposed in a pixel region of a matrix arrangement.

4. The device according to claim 1, wherein the absorber includes a fine powder.

5. The device according to claim 1, wherein the plurality of grooves are formed by bending the packaging plate into a desired shape.

6. The device according to claim 5, wherein the packaging plate is formed of canister.

7. The device according to claim 1, wherein the plurality of grooves are formed by molding inner sides of the packaging plate.

8. The device according to claim 7, wherein the packaging plate includes one of a glass and plastic material.

9. The device according to claim 1, wherein the plurality of grooves are arranged in a matrix configuration pattern.

10. The device according to claim 1, wherein each of the plurality of grooves is formed in one of a circular and square shape.

11. The device according to claim 1, wherein upper and lower surfaces of the packaging plate are planar.

12. The device according to claim 1, wherein the plurality of semi-transparent films include one of paper and Teflon material.

13. An electroluminescence display device that actively drives a plurality of pixel regions defined on a transparent substrate, comprising:

a plurality of switching thin film transistors and light-emitting thin film transistors provided in each of the plurality of pixel regions, the electroluminescence display device is connected to the plurality of light-emitting thin film transistors for controlling emission of light;

a packaging plate having a plurality of grooves formed at a side opposite to the transparent substrate;

an absorber contained within each of the plurality of grooves at least to remove water in the electroluminescence display device;

a semi-transparent film attached to the packaging plate and the absorber; and an adhesive attaching the transparent substrate to the packaging plate to oppose each other.

14. The device according to claim 13, further comprising a plurality of storage capacitors, each connected to a corresponding one of the plurality of switching thin film transistors.

15. The device according to claim 13, wherein the absorber includes a fine powder.

16. The device according to claim 13, wherein the packaging plate is formed of a canister.

17. The device according to claim 13, wherein the packaging plate is formed from one of a glass and plastic material.

18. The device according to claim 13, wherein upper and lower surfaces of the packaging plate are planar.

19. A packaging plate for an electroluminescence display device, comprising:

a plurality of grooves formed at a first side;

a plurality of absorbers arranged in a matrix pattern, each absorber contained within each of the plurality of grooves at least to remove water in the electroluminescence display device, and a plurality of semi-transparent films disposed on a lower surface of the packaging plate and on each of the plurality of absorbers.

20. The device according to claim 19, wherein upper and lower surfaces of the packaging plate are parallel to an upper surface of the cathode electrode.

21. The device according to claim 19, wherein each of the plurality of grooves is formed in one of a circular and square shape.

* * * * *